US007643297B2

(12) United States Patent
Tominaga et al.

(10) Patent No.: US 7,643,297 B2
(45) Date of Patent: Jan. 5, 2010

(54) ELECTRONIC CONTROL APPARATUS (75) Inventors: Tsutomu Tominaga, Tokyo (JP); Takayuki Kifuku, Tokyo (JP); Shuzo Akiyama, Tokyo (JP); Tadayuki Fujimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 53 days.

(21) Appl. No.: 11/934,448

(22) Filed: Nov. 2, 2007

(65) Prior Publication Data
US 2008/0278918 A1 Nov. 13, 2008

(30) Foreign Application Priority Data
May 7, 2007 (JP) .............................. 2007-122385

(51) Int. Cl.
*H05K 7/20* (2006.01)

(52) U.S. Cl. ................... 361/704; 361/707; 361/719; 165/80.2

(58) Field of Classification Search ................. 361/601, 361/641, 642, 643, 648, 704, 719, 720; 174/52.1, 174/52.2; 165/80.3, 104.33
See application file for complete search history.

(56) References Cited

U.S. PATENT DOCUMENTS

| 5,966,291 | A | * | 10/1999 | Baumel et al. | 361/707 |
|---|---|---|---|---|---|
| 6,028,770 | A | * | 2/2000 | Kerner et al. | 361/704 |
| 6,091,604 | A | * | 7/2000 | Plougsgaard et al. | 361/707 |
| 6,282,092 | B1 | * | 8/2001 | Okamoto et al. | 361/704 |
| 6,337,796 | B2 | * | 1/2002 | Yamada et al. | 361/719 |
| 6,522,528 | B2 | * | 2/2003 | Yamane | 361/601 |
| 6,625,027 | B2 | * | 9/2003 | Rider et al. | 361/706 |
| 6,657,866 | B2 | * | 12/2003 | Morelock | 361/719 |
| 6,661,659 | B2 | * | 12/2003 | Tamba et al. | 361/699 |
| 6,724,627 | B2 | * | 4/2004 | Onizuka et al. | 361/704 |
| 6,924,985 | B2 | * | 8/2005 | Kawakita et al. | 361/715 |
| 6,972,959 | B2 | * | 12/2005 | Asai et al. | 361/719 |
| 7,035,105 | B2 | * | 4/2006 | Yamaguchi | 361/707 |
| 7,099,155 | B2 | * | 8/2006 | Kobayashi et al. | 361/719 |
| 7,154,753 | B2 | * | 12/2006 | Kobayashi | 361/715 |
| 7,375,966 | B2 | * | 5/2008 | Murakami et al. | 361/707 |
| 7,417,861 | B2 | * | 8/2008 | Kikuchi et al. | 361/718 |
| 2005/0094356 | A1 | | 5/2005 | Onizuka et al. | |
| 2005/0135065 | A1 | | 6/2005 | Nakatsu et al. | |

FOREIGN PATENT DOCUMENTS

DE 102 25 993 A1 12/2003
EP 1 245 455 A2 10/2002

(Continued)

*Primary Examiner*—Boris L Chervinsky
(74) *Attorney, Agent, or Firm*—Sughrue Mion, PLLC (57) ABSTRACT An electronic control apparatus can be reduced in size and cost by removing a metal substrate part. The apparatus includes a housing having a pair of opening portions at its opposite sides, a heat sink attached to one of the opening portions of the housing, a pair of semiconductor switching elements mounted on the heat sink, a circuit board arranged in opposition to the heat sink, a plurality of conductive plates electrically connecting the circuit board and the semiconductor switching elements to each other, and a plate spring urging the semiconductor switching elements against the heat sink. The plate spring has engagement portions press-fitted to and engaged with inner sides of holding portions which are formed on the housing, and the housing has engagement portions engaged with protruded portions of the heat sink.

12 Claims, 7 Drawing Sheets

FOREIGN PATENT DOCUMENTS

| | | |
|---|---|---|
| JP | 08-083873 | 3/1996 |
| JP | 09-134985 | 5/1997 |
| JP | 10-189843 | 7/1998 |
| JP | 11-012797 | 1/1999 |
| JP | 2000-43740 A | 2/2000 |
| JP | 3644835 B2 | 7/2000 |
| JP | 2002-293202 | 10/2002 |
| JP | 2003-124662 | 4/2003 |
| JP | 2003-309384 A | 10/2003 |
| JP | 2005-038939 | 2/2005 |
| JP | 2005-212722 | 8/2005 |
| JP | 2005-235992 | 9/2005 |
| JP | 2005-329867 | 12/2005 |
| JP | 2006-261555 | 9/2006 |
| JP | 2006-290041 | 10/2006 |
| KR | 0379765 | 6/2003 |

* cited by examiner

ELECTRONIC CONTROL APPARATUS

BACKGROUND OF THE INVENTION

1. Field of the Invention

The present invention relates to an electronic control apparatus used in an electric power steering system for providing an assist force to a steering system of a vehicle by means of the rotational force of an electric motor.

2. Description of the Related Art

In the past, there has been known an electronic control apparatus in which a semiconductor switching element (FET), being a power device, is mounted on a metal substrate, and at the same time, a connecting member for electrically connecting between the metal substrate and parts outside thereof is mounted on the metal substrate.

For example, an electronic control apparatus as described in a first patent document (Japanese patent No. 3644835) includes a metal substrate on which a bridge circuit comprising semiconductor switching elements are mounted for switching a current supplied to an electric motor, a housing with conductive plates, etc., insert molded into an insulating resin and having high current parts mounted thereon, a control board having low current parts such as a microcomputer, etc., mounted thereon, a connecting member for electrically connecting the metal substrate to the housing and the control board, a heat sink being in intimate contact with the metal substrate, and a case being press molded from a metal plate so as to cover the metal substrate, the housing and the control board and mounted on the heat sink.

In the electric control apparatus as described in the above-mentioned first patent document, there arises the following problem. That is, the metal substrate on which the semiconductor switching elements are mounted is needed, and the number of parts required is increased, so the size of the electronic control apparatus is enlarged, and the production cost becomes high.

SUMMARY OF THE INVENTION

Accordingly, the present invention is intended to obviate the problem as referred to above, and has for its object to provide an electronic control apparatus in which some parts such as a metal substrate, etc., are eliminated so as to reduce the size and the cost of production thereof.

Bearing the above object in mind, an electronic control apparatus according to the present invention includes a housing that is made of an insulating resin and has a pair of opening portions at opposite sides thereof, respectively; a heat sink that is attached to one of the opening portions of the housing; a power device that is mounted on the heat sink; a circuit board that is arranged in opposition to the heat sink, and has an electronic circuit including a control circuit for controlling the power device; a plurality of conductive plates that have their base portions held by the housing and electrically connect the circuit board and the power device to each other; and a resilient member that urges the power device to the heat sink. The resilient member is engaged with the housing 3.

According to the electronic control apparatus of the present invention, there is obtained an advantageous effect that the apparatus can be reduced in size and cost.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described in detail while referring to the accompanying drawings. Throughout figures in the drawings, the same or corresponding members or parts are identified by the same reference numerals or characters.

In the following embodiments, description will be made by taking, as an example, an electronic control apparatus used in an electric power steering system that serves to assist a steering system of a vehicle by means of the rotational force of an electric motor.

Embodiment 1

Figure 1:
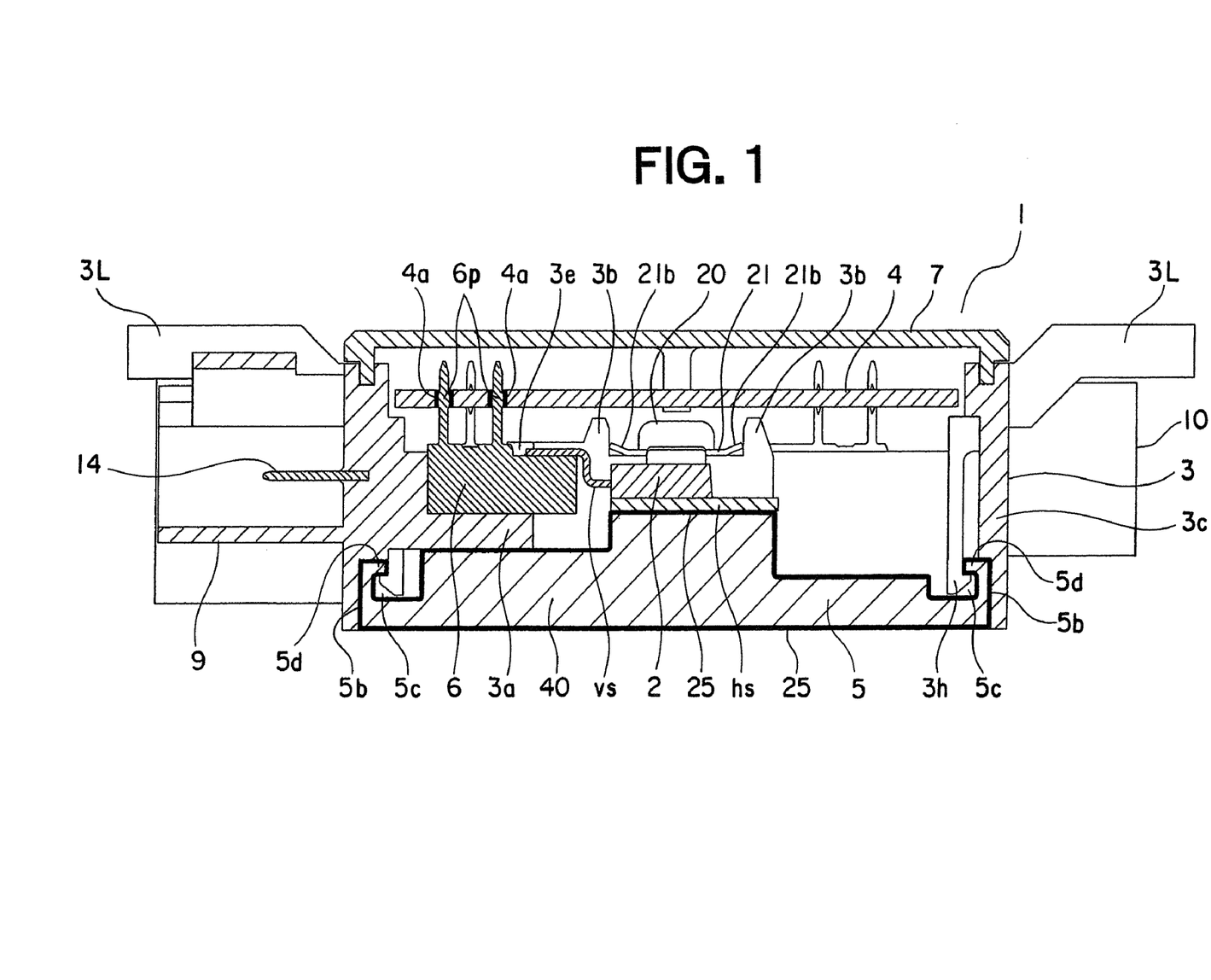
FIG. 1 is a cross sectional view showing an electronic control apparatus in an electric power steering system according to a first embodiment of the present invention.
Figure 2:
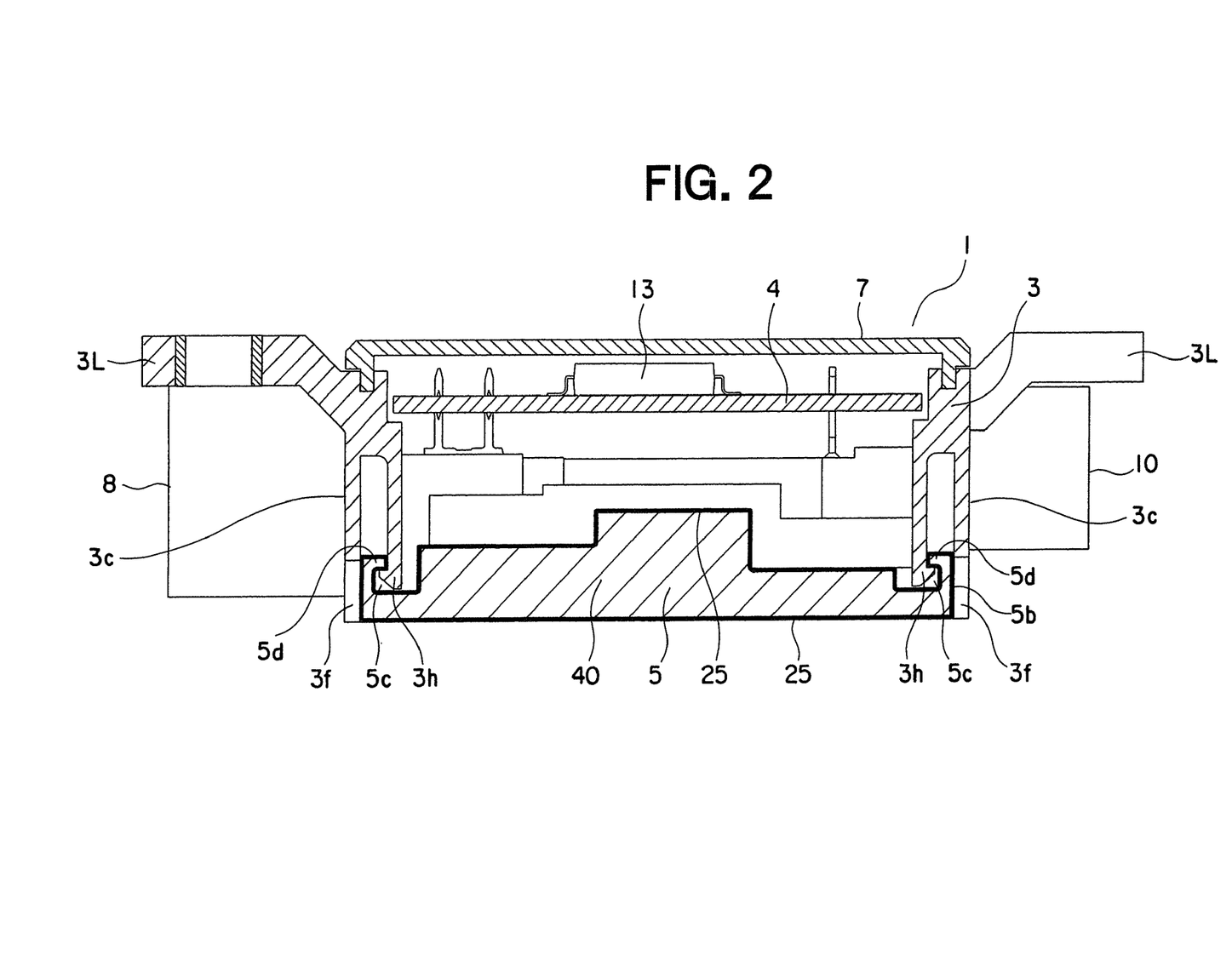
FIG. 2 is a cross sectional view of the electronic control apparatus when cut in parallel to a cross sectional surface of FIG. 1.
Figure 3:
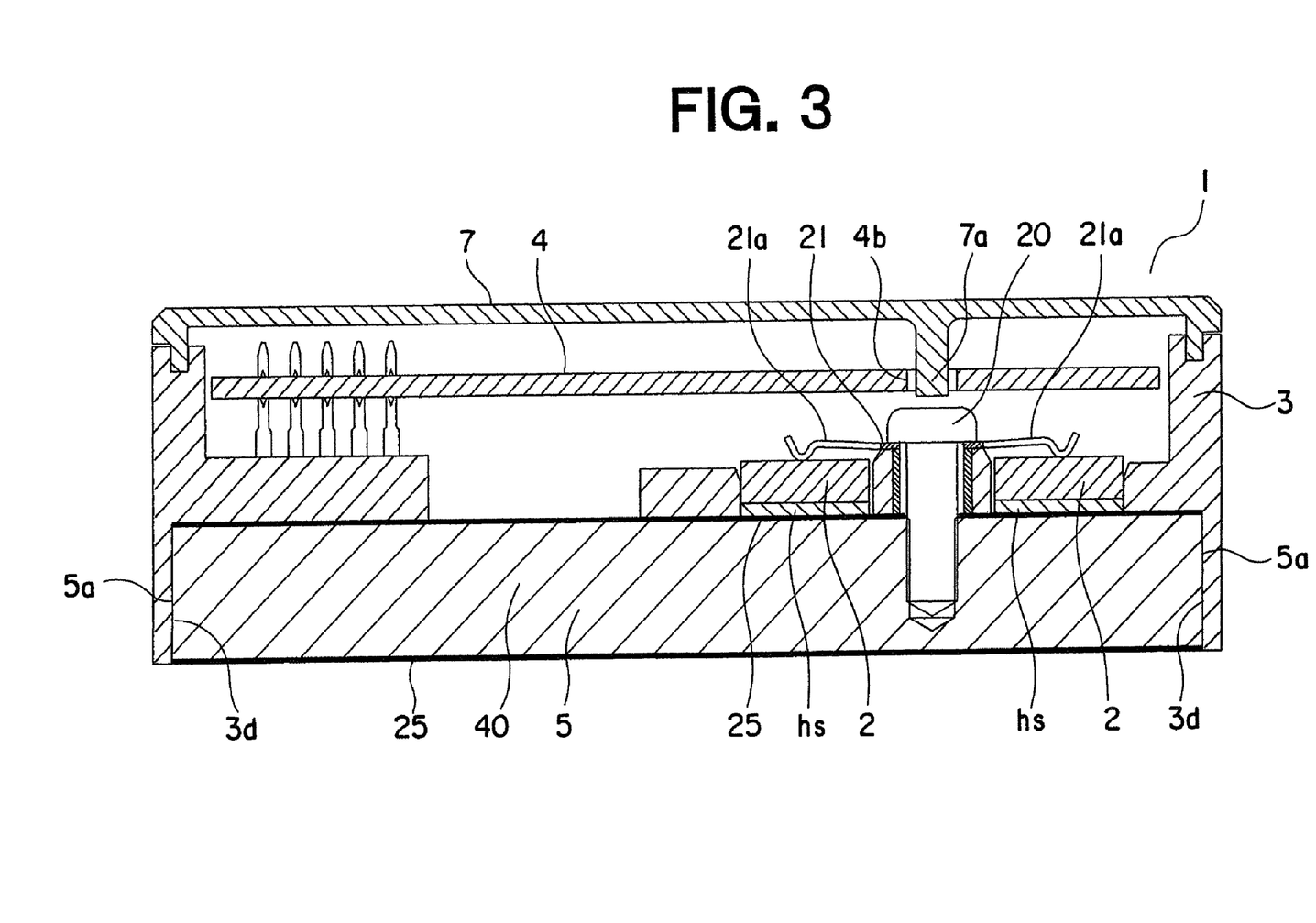
FIG. 3 is a cross sectional view of the electronic control apparatus when cut in a direction perpendicular to the cross sectional surface of FIG. 1.
Figure 4:
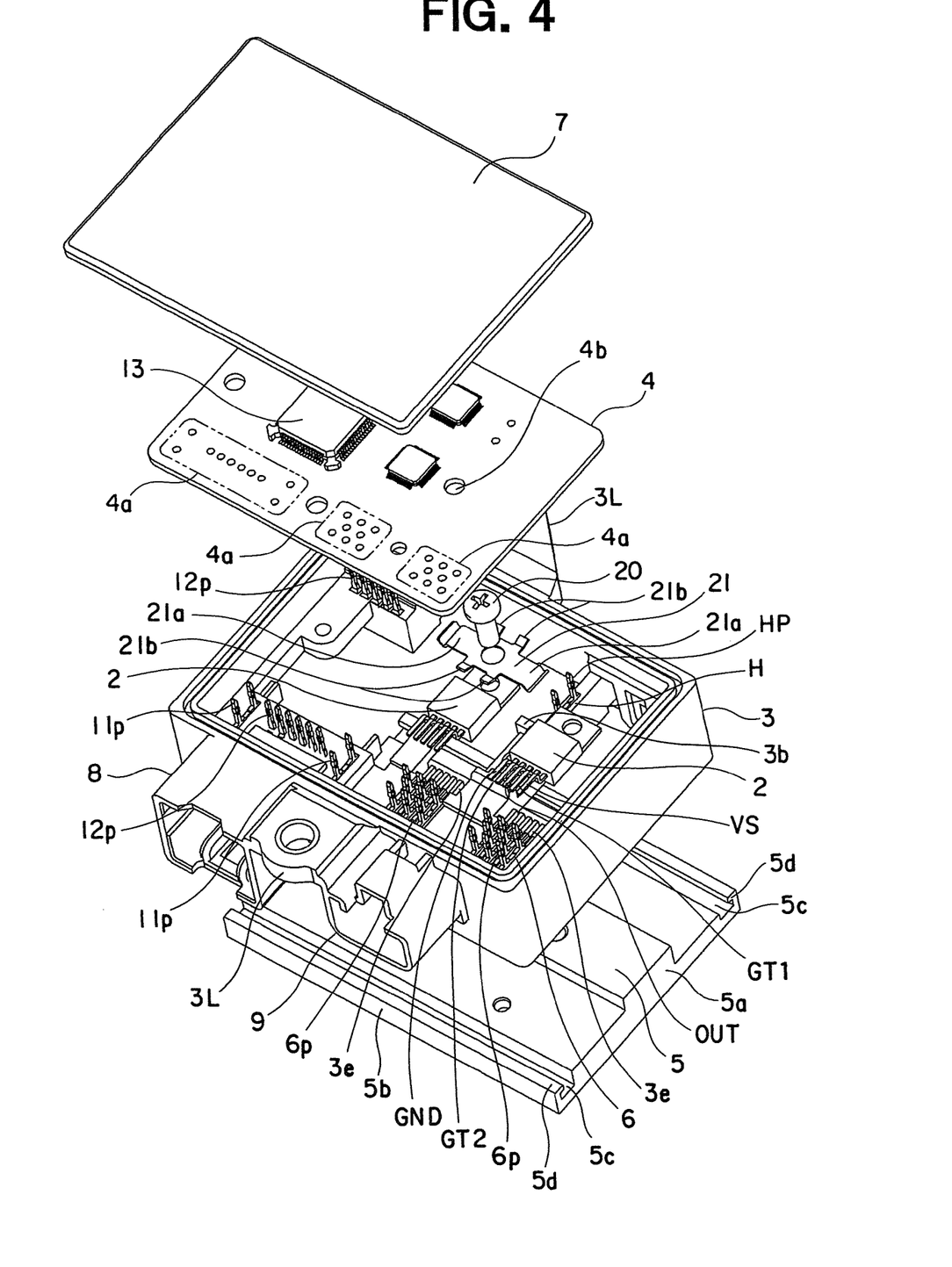
FIG. 4 is an exploded perspective view showing the electronic control apparatus in FIG. 1.
Figure 5:
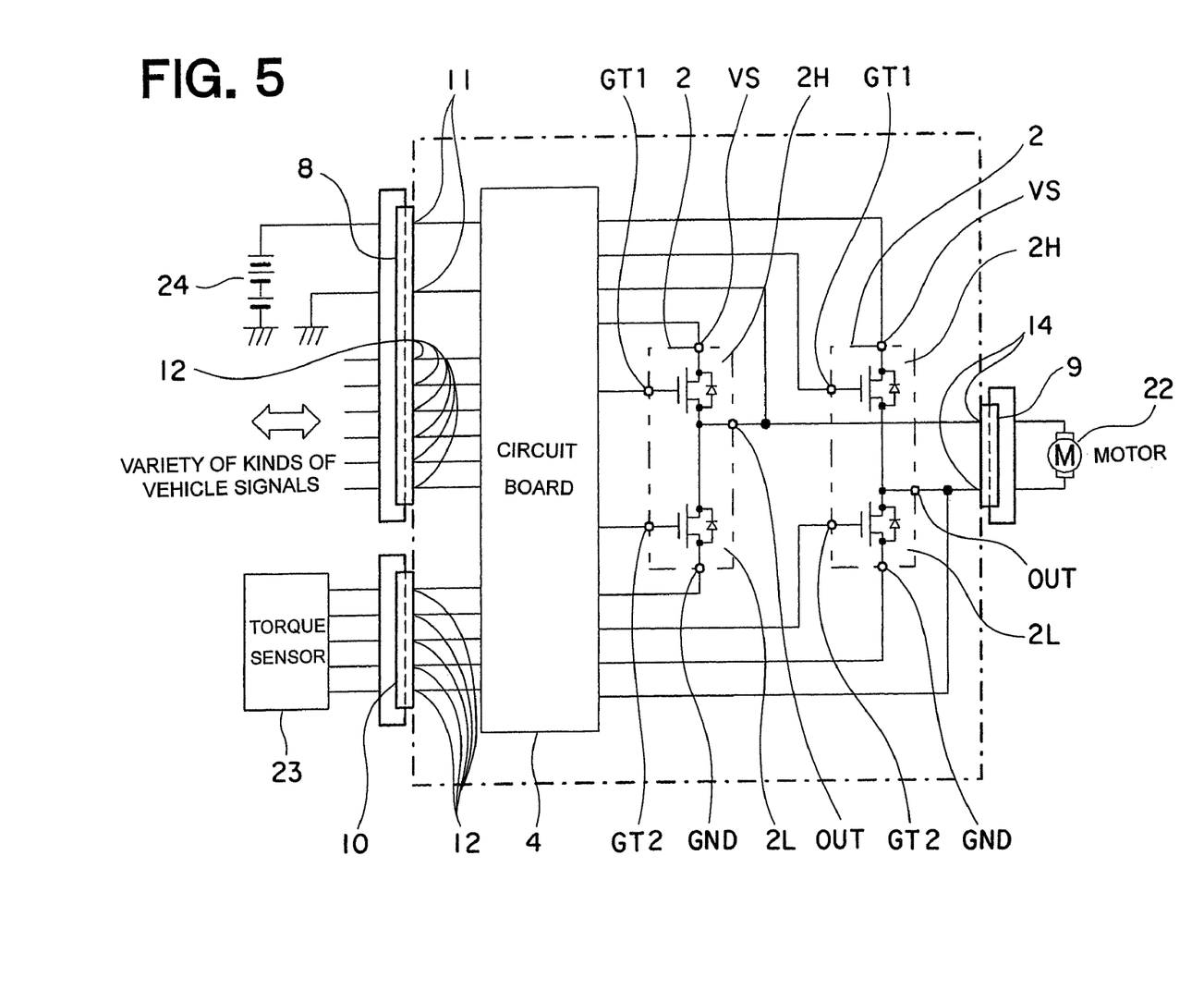
FIG. 5 is a block diagram showing the electric power steering system in FIG. 1.

Referring to the drawings and first to FIG. 1, there is shown, in cross section, an electronic control apparatus according to a first embodiment of the present invention. FIG. 2 is a cross sectional view of the electronic control apparatus when cut in parallel to a cross sectional surface of FIG. 1, and FIG. 3 is a cross sectional view of the electronic control apparatus when cut in a direction perpendicular to the cross sectional surface of FIG. 1. FIG. 4 is an exploded perspective view that shows the electronic control apparatus in FIG. 1, and FIG. 5 is a block diagram that shows an electric power steering system in FIG. 1.

The electronic control apparatus, generally designated at 1, includes a housing 3 of a box shape that has a pair of opening portions at opposite sides thereof, respectively, a heat sink 5 that is made of aluminum and attached to one of the opening portions in the housing 3, a pair of semiconductor switching elements 2 that are mounted on the heat sink 5 and constitutes a power device, and a circuit board 4 that is arranged in parallel to and in opposition to the heat sink 5, and has an electronic circuit formed thereon which includes a control circuit for controlling the semiconductor switching element 2.

In addition, the electronic control apparatus 1 further includes a plurality of power conductive plates 6 that have their base end portions formed integrally with the housing 3 by means of insert molding of an insulating resin 3a and electrically connect the circuit board 4 and the semiconductor switching elements 2 to each other, a plate spring 21 made of metal that serves as a resilient member for urging a pair of resin packages of the semiconductor switching elements 2 so as to place a heat spreader hs into intimate contact with the heat sink 5, and a cover 7 that is attached to the other opening portion in the housing 3 so as to receive the semiconductor switching elements 2 and the circuit board 4 in cooperation with the heat sink 5.

The plate spring 21 is formed, for example, by press working a spring stainless steel plate by means of a press working machine, and has a pair of presser portions 21a that presses or pushes the resin packages of the semiconductor switching elements 2, and engagement portions 21b that extend in directions orthogonal to the presser portions 21a. The engagement portions 21b are press-fitted into and engaged with inner sides of corresponding holding portions 3b that are integrally molded with the housing 3 by the use of an insulating resin.

In addition, the plate spring 21 is fixedly secured to the heat sink 5 by means of a fastening element in the form of a screw 20 with the housing 3 interposed therebetween.

Also, the housing 3 has a pair of side walls 3c which are formed at their inner sides with a pair of engagement portions 3h each having a hook-shaped end integrally molded therewith by the use of an insulating resin. The housing side walls 3c are notched at regions opposing to the engagement portions 3h to form a pair of notched portions 3f, respectively.

The heat sink 5 is formed at its opposites side edges with a pair of grooves 5c each extending in a straight line, and with a pair of inwardly protruded portions. The housing 3 is attached to the heat sink 5 by inserting tip end portions of the engagement portions 3h into the corresponding grooves 5c thereby to be placed into engagement with the protruded portions 5d, respectively. At this time, the tip end portions of the engagement portions 3h are placed into abutment with the protruded portions 5d. Accordingly, the housing 3 is mounted on the heat sink 5 by the screw 20 and the engagement portions 3h.

Here, note that the plate spring 21 may be made of metal materials other than the spring stainless steel plate, such as for example a spring phosphor bronze plate.

In addition, the electronic control apparatus 1 also includes a vehicle connector 8 that is arranged at one side surface of the housing 3 and electrically connected to vehicle wiring, a motor connector 9 that is also arranged at the one side surface of the housing 3 and electrically connected to an electric motor 22, and a sensor connector 10 that is arranged at the other side surface of the housing 3 and electrically connected to a torque sensor 23.

The vehicle connector 8 is provided with a power supply connector terminal 11 electrically connected to a battery 24 of the vehicle, and a signal connector terminal 12 to and from which a variety of signals are input and output through the vehicle wiring. The sensor connector 10 is provided with the same signal connector terminal 12 as that used for the vehicle connector 8.

When the housing 3 is formed by insert molding, the vehicle connector 8 having the power supply connector terminal 11 and the signal connector terminal 12, the motor connector 9 having the motor connector terminal 14, and the sensor connector 10 having the signal connector terminal 12 are formed integrally with one another together with the conductive plates 6.

Moreover, the housing 3 is formed, at its side surfaces at the opening side opposite to the opening portion to which the heat sink 5 is attached, with mounting leg portions 3L for mounting the electronic control apparatus 1 to the vehicle that is an object to be mounted thereon.

The heat sink 5 is composed of a heat sink main body 40, and an alumite or anodized aluminum film 25 that is an insulating film formed on a surface of the heat sink main body 40. The heat sink 5 is formed as follows. That is, a heat sink material is first produced which is composed of an elongated, extruded shaped member that is made by extruding aluminum or aluminum alloy from a die and has an anodized aluminum film 25 formed on an entire surface thereof beforehand, and then the heat sink material thus produced is cut to a desired length by a cutting machine to form the heat sink 5.

The heat sink 5, having been thus formed by cutting the heat sink material by means of the cutting machine, has one pair of opposite outer peripheral end faces, which are cut surfaces 5a from which the heat sink main body 40 is exposed to the outside, and another pair of opposite outer peripheral end faces 5b have anodized aluminum films 25 formed thereon. Also, the heat sink 5 has a front surface, on which the semiconductor switching elements 2 are mounted, and a rear surface, with anodized aluminum films 25 being formed on these front and rear surfaces. The cut surfaces 5a are arranged in opposition to inner wall surfaces 3d of the housing 3, as shown in FIG. 3.

Here, note that the heat sink 5 is produced by using the extruded shaped material, but it may be produced by applying a cutting work to a hot or cold forged heat sink material, or may instead be produced by applying a cutting work to a hot or cold rolled plate material.

In addition, four faces or a part of the outer peripheral end faces of the heat sink main body 40 may be exposed to the outside and arranged in opposition to the inner wall surfaces 3d of the housing 3.

The plate spring 21 serves to fixedly secure the semiconductor switching elements 2 by being pressed or pushed against the resin package surfaces of the semiconductor switching elements 2 thereby to urge a heat dissipation part in the form of the heat spreader hs into intimate contact with a surface of the heat sink 5 on which the anodized aluminum film 25 is formed. The heat spreader hs of the semiconductor switching elements 2, being electrically connected to a bridge output terminal OUT of the semiconductor switching elements 2, is electrically insulated from the heat sink 5 by means of the anodized aluminum film 25.

The surface of the heat sink 5 has small irregularities, so even if the heat spreader hs of the semiconductor switching elements 2 is placed in intimate contact with the heat sink 5 under the action of the plate spring 21, there will occur a slight gap therebetween, which increases the thermal resistance of a heat conduction path through which the heat generated by the semiconductor switching elements 2 is radiated to the heat sink 5. In order to fill the gap, a grease of high thermal conductivity (not shown) is interposed between the heat spreader hs and the anodized aluminum film 25 of the heat sink 5.

Here, note that as a means for filling the gap between the semiconductor switching elements 2 and the heat spreader hs, a resin of high thermal conductivity may be used to intimately contact and fixedly secure the heat spreader hs to the heat sink 5.

Each of the semiconductor switching elements 2 has a high side MOSFET 2H and a low side MOSFET 2L integrated with each other to form a half bridge, as shown in FIG. 5. In each of the semiconductor switching elements 2, the half bridge thus formed is received in one package, and a pair of two half bridges form a bridge circuit for switching a current supplied to the electric motor 22.

The terminals of a semiconductor switching element 2 for each half bridge comprise a power supply terminal VS, a gate terminal GT1 and a bridge output terminal OUT of the high side MOSFET 2H, and a gate terminal GT2 and a ground terminal GND of the low side MOSFET 2L. Here, the power supply terminal VS, the bridge output terminal OUT, and the ground terminal GND are large current terminals through which the current of the electric motor 22 flows, and the gate terminal GT1 and the gate terminal GT2 are small current terminals for signals.

A microcomputer 13 is mounted on a wiring pattern on the circuit board 4 by soldering. Though not illustrated in FIG. 4, mounted on the wiring pattern on the circuit board 4 by soldering are a coil for preventing electromagnetic noise generated upon switching operation of the semiconductor switching elements 2 from flowing out to the outside, capacitors for absorbing ripples of motor current, a motor current detection circuit including shunt resistors, peripheral circuit elements, etc.

Also, in the circuit board 4, there are formed a plurality of through holes 4a which have copper plating applied to their inner surfaces and are electrically connected to the wiring pattern on the circuit board 4.

Each of the conductive plates 6 has a base end portion electrically connected to the tip end portions of the power supply terminal VS, the bridge output terminal OUT, the ground terminal GND, and the gate terminals GT1, GT2, respectively, of a corresponding semiconductor switching element 2 by means of laser welding. The individual conductive plates 6 are arranged side by side along a direction in which the terminals VS, GT1, OUT, GT2, GND of the semiconductor switching elements 2 lead out, as shown in FIG. 4.

The individual conductive plates 6 are formed with press-fit terminal portions 6p, which are press-fitted into the individual through holes 4a, respectively, in the circuit board 4, so that the terminals VS, GT1, OUT, GT2, GND of the semiconductor switching elements 2 are electrically connected to the wiring pattern of the circuit board 4.

The conductive plates 6 are made of a material of a copper alloy or phosphor bronze of high strength and high electrical conductivity in consideration of electrical conductivity for supplying a large current and mechanical strength required to form the press-fit terminal portions 6p. With the conductive plates 6 made of phosphor bronze, for instance, a motor current equal to or less than 30 A is used for example.

Though not shown, it is constructed such that the motor current from the bridge output terminals OUT of the semiconductor switching elements 2 flows directly to the electric motor 22 via the motor connector terminals 14 without passing through the circuit board 4. Each of the output conductive plates 6 is formed, at its intermediate portion electrically connected to the corresponding bridge output terminal OUT, with the press-fit terminal portions 6p extending toward the circuit board 4, so that a signal to monitor the voltage of a corresponding motor connector terminal 14 is output to the circuit board 4.

The semiconductor switching elements 2 have the power supply terminals VS, the gate terminals GT1, the bridge output terminals OUT, the gate terminals GT2, and the ground terminals GND lead out in an arrangement as shown in FIG. 4. The terminals GT1, GT2 through which small current flows are arranged in a sandwiched manner between the terminals VS, OUT, GND through which a large current flows.

The individual terminals VS, GT1, OUT, GT2, GND of the semiconductor switching elements 2 are formed in such a manner that they have a width of 0.8 mm, a thickness of 0.5 mm and an interval between adjacent terminals VS, GT1, OUT, GT2, GND of 1.7 mm. In each of the terminals VS, OUT, GND where a large current flows, the electrical resistance thereof becomes larger in accordance with the increasing length thereof, so the generation of heat increases.

In this first embodiment of the present invention, however, to suppress the generation of heat, the power supply terminals VS, the welding between the ground terminals GND and the bridge output terminals OUT are welded to the corresponding conductive plates 6 at locations close to the semiconductor switching elements 2, respectively.

In addition, the intervals between the adjacent individual terminals VS, GT1, OUT, GT2, GND are narrow, so in order to prevent a short circuit between the terminals VS, GT1, OUT, GT2, GND, the respective welding positions of the gate terminals GT1, GT2 with the individual conductive plates 6 are at positions not close to the respective welding positions of the power supply terminals VS, the ground terminals GND, the bridge output terminals OUT with the individual conductive plates 6. That is, the current flowing through the terminals GT1, GT2 is small, so the welding positions of these terminals GT1, GT2 are more remote from the semiconductor switching elements 2 than the wedding positions of the terminals VS, OUT, GND are.

The housing 3 is formed with positioning portions 3e for performing the positioning of the individual terminals VS, GT1, OUT, GT2, GND of the semiconductor switching elements 2 with respect to the conductive plates 6. The positioning portions 3e protrude between the individual adjacent terminals VS, GT1, OUT, GT2, GND of the semiconductor switching elements 2, and have tapered portions formed at their tip ends, respectively. The tip ends of the individual terminals VS, GT1, OUT, GT2, GND of the semiconductor switching elements 2 are respectively guided and positioned by the tapered portions, and in this state, the individual terminals VS, GT1, OUT, GT2, GND are welded to the conductive plates 6.

Although the power conductive plates 6 are made of rolled copper or copper alloy, a large current flows upon welding of the rolled surfaces (the front surfaces) of the conductive plates 6 and the terminals VS, OUT, GND of the semiconductor switching elements 2, so it is necessary to increase the thickness of the conductive plates 6.

However, it is difficult to increase the thicknesses of the conductive plates 6 from the viewpoint of the formation of the press-fit terminal portions and the press working thereof. Accordingly, in this embodiment, the thickness of the conductive plates 6 is 0.8 mm which is the same as the width of the terminals VS, OUT, GND, and the width of the conductive plates 6 is thus formed wider than the thickness thereof, and the terminals VS, OUT, GND of the semiconductor switching elements 2 are welded to the end faces of the conductive plates 6 orthogonal to the rolled surfaces thereof.

That is, the conductive plates 6 are formed in such a manner that they have a size or length in a direction of connection to the terminals VS, OUT, GND larger than that in a direction (widthwise direction) orthogonal to the direction of connection, as a consequence of which it is possible to ensure a large current passage sectional area thereby to reduce the electric resistance thereof without increasing the thickness of the conductive plates 6, though a large current flows through the terminals VS, OUT, GND.

Here, note that a small current flows through the conductive plates 6 for signal use, so there is no need to consider the reduction in the electrical resistance of the conductive plates 6 for signal use, which are, however, formed of a plate material similar to that for the conductive plates 6 through which a large current flows.

In addition, laser welding is performed by irradiating a laser beam from a terminal (VS, GT1, OUT, GT2, GND) side of the semiconductor switching elements 2 having a thin thickness.

Moreover, the press-fit terminal portions 6p of the adjacent conductive plates 6 are arranged in a staggered manner, so that the distance between the adjacent press-fit terminal portions 6p is set longer than the distance between the adjacent terminals VS, GT1, OUT, GT2, GND of the semiconductor switching elements 2.

Further, the insulating resin 3a of the housing 3 is interposed between the individual conductive plates 6 and the heat sink 5, respectively. The press-fit terminal portions 11p of the power supply connector terminal 11 are press-fitted into the through holes 4a of the control board 4, whereby the power supply connector terminal 11 of the vehicle connector 8 is electrically connected to the wiring pattern of the control board 4. The sensor connector terminals 12 of the sensor connector 10 are each formed of a phosphor bronze plate having a thickness of 0.64 mm, and each have a press-fit terminal portion 12p formed at one end thereof.

In addition, as shown in FIG. 4, holding members H are provided for holding the circuit board 4 in place. The power conductive plates 6 are used as the holding members H as they are, and the holding members H have press-fit terminal portions Hp formed at their tip ends, respectively. The press-fit terminal portions 6p, 11p, 12p, Hp are press-fitted into the through holes 4a in the circuit board 4, whereby the circuit board 4 is mechanically held in place.

The cover 7 is molded of an insulating resin similar to the housing 3, and has a convex portion 7a integrally formed therewith at its inner side by means of integral molding, as shown in FIG. 3. The convex portion 7a protrudes from a hole 4b formed in the control board 4, and is disposed above the head of the screw 20 that fixedly secure the housing 3 to the heat sink 5. The cover 7 is welded to the opening surface of the housing 3 by means of an ultrasonic welding machine.

Here, note that the welding of the cover 7 and the housing 3 may be effected through vibration welding by means of a vibration welding machine. In the case of the vibration welding, the cover 7 is caused to reciprocatingly vibrate along a surface direction of the bonding or coupling surfaces of the cover 7 and the housing 3 so as to melt the resins of the cover 7 and the housing 3 with each other under the action of frictional heating thereby to bond or couple them with each other. Further, in the case of the vibration welding, the cover 7 is caused to reciprocatingly vibrate, so it is necessary to make the diameter of the hole 4b in the control board 4 larger than the diameter of convex portion 7a.

Also, laser welding by means of a laser welding machine may be used instead of the ultrasonic welding. For laser welding, the cover 7 is made of a material having a large laser transmittance, and the housing 3 is made of a material having a high laser absorption rate. When a laser beam is irradiated from the cover 7 side, it passes through the cover 7 and is absorbed by the bonding surface of the housing 3 to generate heat. The heat thus generated is also conducted to the cover 7, whereby the cover 7 is heated to mutually melt the bonding surfaces of the cover 7 and the housing 3 to be welded to each other.

Laser welding can not be used in the molding of a resin in which warpage or shrinkage is large and hence it is difficult for a laser beam to be focused on the bonding surfaces, but in case of the molding of a resin in which warpage or shrinkage is small, welding itself does not generate burrs or vibration, so there is an advantage that the transmission of vibration to internal parts does not occur.

Now, reference will be made to a procedure of assembling the electronic control apparatus 1, as constructed above.

First of all, a cream solder is coated on the circuit board 4, and then parts such as the microcomputer 13, its peripheral circuit elements, etc., are arranged on the circuit board 4 thus coated with the cream solder, after which the cream solder is melted by using a reflow device so that the individual parts are soldered to the circuit board 4.

Then, as shown in FIGS. 1 through 3, the housing 3 is arranged on the heat sink 5, and the engagement portions 3h are inserted into the grooves 5c thereby to place the housing 3 into engagement with the heat sink 5.

Thereafter, the semiconductor switching elements 2 are arranged on the heat sink 5, and the terminals VS, GT1, OUT, GT2, GND of the semiconductor switching elements 2 and the conductive plates 6 are positioned in place by means of the positioning portions 3e, after which the engagement portions 21b are press-fitted to the inner sides of the holding portions 3b thereby to place the plate spring 21 into engagement with the housing 3.

Subsequently, the plate spring 21 is fixedly secured to the heat sink 5 together with the housing 3 by using the screw 20, and the semiconductor switching elements 2 are placed into intimate contact with and fixedly secured to the heat sink 5 by means of the presser portions 21a of the plate spring 21.

Then, a laser beam is irradiated from the side of terminals VS, GT1, OUT, GT2, GND of the semiconductor switching elements 2, whereby the terminals VS, GT1, OUT, GT2, GND and the individual conductive plates 6 are respectively welded to each other by means of laser welding.

Thereafter, the circuit board 4 is mounted on an upper portion of the housing 3 with the tip ends of the press-fit terminal portions 6p, 11p, 12p, Hp being inserted into the through holes 4a in the circuit board 4. After that, the press-fit terminal portions 6p, 11p, 12p, Hp are press-fitted into the through holes 4a, respectively, by means of a press machine.

Then, the cover 7 is arranged on the opening surface of the housing 3, and the housing 3 and the cover 7 are welded to each other by the ultrasonic welding machine, whereby the assembly of the electronic control apparatus 1 is completed.

As described in the foregoing, the electronic control apparatus 1 according to this first embodiment includes the housing 3 made of an insulating resin and having the opening portions at its opposite sides, respectively, the heat sink 5 attached to one of the opening portions of the housing 3, the semiconductor switching elements 2 mounted on the heat sink 5, the circuit board 4 arranged in opposition to the heat sink 5 and having the electronic circuit formed thereon including the control circuit for controlling the semiconductor switching elements 2, the plurality of conductive plates 6 having their base portions held by the housing 3 and electrically connecting the circuit board 4 and the semiconductor switching elements 2 to each other, and the plate spring 21 for urging the semiconductor switching elements 2 against the heat sink 5. As a result, the electronic control apparatus 1 makes it unnecessary to use a metal substrate or the like conventionally required on which the semiconductor switching elements 2 are to be mounted, so the apparatus 1 can be reduced in size and cost.

In addition, the plate spring 21 is formed with the presser portions 21a for urging or pressing the resin packages of the semiconductor switching elements 2, and with the engagement portions 21b extending in the direction perpendicular to the presser portions 21a. The engagement portions 21b are press-fitted to and engaged with the inner sides of the corresponding holding portions 3b that are integrally molded with the housing 3 by the use of an insulating resin, so the plate spring 21 can be fixed to the housing 3 prior to the tightening of the screw 20, thus making it easy to tighten the screw 20 for improved assembling efficiency.

Moreover, the plate spring 21 is made of metal, so the semiconductor switching elements 2 can be made into intimate contact with the heat sink 5 for a long period of time, thereby improving the reliability of heat dissipation.

Further, the plate spring 21 is not only engaged with the housing 3 but also fixedly secured to the heat sink 5 by means of the screw 20 with the housing 3 interposed therebetween, so a reduction of the urging force, acting to make the semiconductor switching elements 2 into intimate contact with the heat sink 5, will be small even if loosening of the screw 20 might occur. Accordingly, the heat generated by the semiconductor switching elements 2 can be dissipated to the heat sink 5, and the reliability of the heat dissipation can be improved.

Furthermore, the housing 3 is engaged with the heat sink 5 by the tip end portions of the engagement portions 3h being inserted into the grooves 5c of the heat sink 5, so the number of the screws for mounting the housing 3 onto the heat sink 5 can be reduced, thus making it possible to improve the assembling efficiency and to reduce the production cost.

Since the engagement portions 3h are integrally molded with the housing 3 by the insulating resin thereof, the number of parts for mounting the housing 3 onto the heat sink 5 can be reduced, thus making it possible to reduce the production cost. Also, the engagement portions 3h are formed on the inner sides of the side walls 3c of the housing 3, so the size of the electronic control apparatus 1 can be reduced.

Moreover, those regions of the side walls 3c of the housing 3 which are in opposition to the engagement portions 3h are removed to form the notched portions 3f, so molding dies can be slid upon molding of the engagement portions 3h, thus making the molding easy.

Further, the heat sink 5 is formed at its opposites side edges with the grooves 5c having the protruded portions 5d, respectively, so that the tip end portions of the engagement portions 3h are inserted into the grooves 5c in the heat sink 5 and prevented from coming off therefrom by the protruded portions 5d, and the inner sides of the end faces of the side walls 3c are placed into abutment with the upper surfaces of the protruded portions 5d of the heat sink 5. With such an arrangement, the housing 3 is engaged with the heat sink 5 in a reliable manner.

Since the heat sink 5 has the anodized aluminum film 25 formed at least on its surface on which the semiconductor switching elements 2 are mounted, the insulating film on the heat sink 5 can be made thinner, thereby making it possible to improve the heat dissipation of the heat sink 5.

In addition, no insulation sheet or the like for the purpose of insulation need be placed between the heat sink 5 and the semiconductor switching elements 2, so the production cost of the electronic control apparatus 1 can be reduced, and at the same time, the assembling efficiency thereof can be improved.

Moreover, the heat sink 5 is formed by cutting the heat sink material in the form of aluminum or aluminum alloy which is composed of an elongated, extruded shaped member having the anodized aluminum film 25 formed on its surface beforehand, so it is unnecessary to form the anodized aluminum film 25 for each of individual heat sink elements after cutting the heat sink 5, and the production cost can be reduced.

Since the grooves 5c and the protruded portions 5d of the heat sink 5 are formed on the heat sink material in the form of the extruded shaped material, no post-processing such as cutting work, etc., is required, and the production cost can be reduced.

Further, the cover 7 has the inwardly protruded convex portion 7a that is formed of an insulating resin by integral molding, and at the same time, the convex portion 7a protrudes from the hole 4b formed in the control board 4 so as to be disposed above the head of the screw 20. Accordingly, even if loosening of the screw 20 occurs, the head of the screw 20 is never short-circuited to the wiring pattern on the circuit board 4, so the reliability of the electronic control apparatus 1 can be improved.

Here, note that the engagement portions 3h may be formed on the inner sides of the side walls 3c of the housing 3, so that the edges of the heat sink 5 are engaged by the tip end portions of the engagement portions.

Embodiment 2

Figure 6:
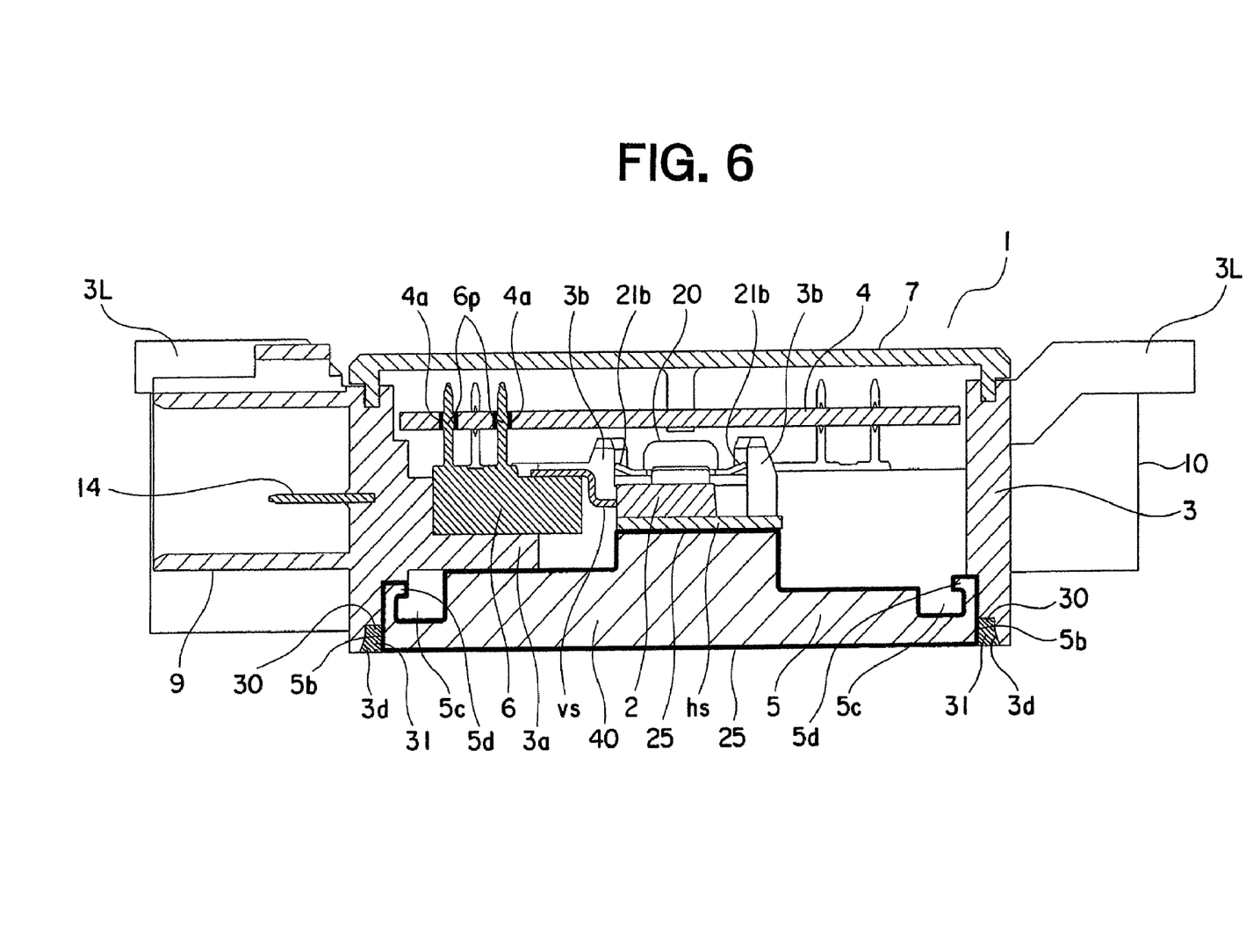
FIG. 6 is a cross sectional view showing an electronic control apparatus in an electric power steering system according to a second embodiment of the present invention.
Figure 7:
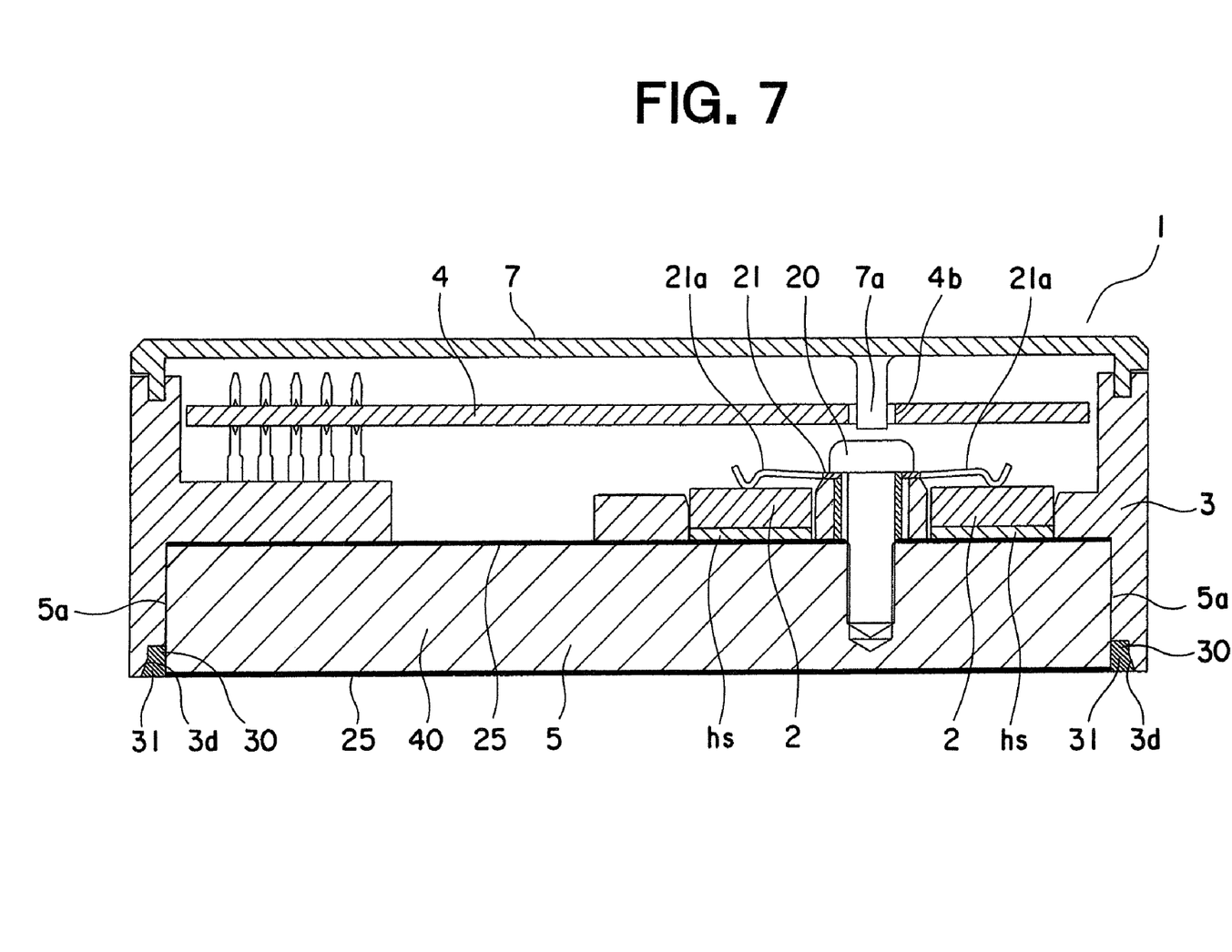
FIG. 7 is a cross sectional view of the electronic control apparatus in FIG. 6 when cut in a direction perpendicular to a cross sectional surface of FIG. 6.

FIG. 6 is a cross sectional view that shows an electronic control apparatus according to a second embodiment of the present invention, and FIG. 7 is a cross sectional view of the electronic control apparatus of FIG. 6 when the electronic control apparatus is cut along a direction perpendicular to the cross section of FIG. 6.

In this second embodiment, the construction of the electronic control apparatus, generally designated at 1, is the same as that of the above-mentioned first embodiment except for the housing 3.

That is, in this second embodiment, grooves 30 are formed between the outer peripheral end faces 5b and the cut surfaces 5a of the heat sink 5 and the inner wall surfaces 3d of the housing 3 at one of the opening portions thereof, and an adhesive or bonding resin in the form of a silicon bonding material 31 is filled into the grooves 30. In addition, the vehicle connector 8, the motor connector 9 and the sensor connector 10 of the first embodiment are changed to corresponding connectors of the waterproof type, respectively, which are integrally molded with the housing 3. Though not illustrated, a respiration or breathing hole for providing fluid communication between the inside and the outside of the electronic control apparatus 1 is formed through the housing 3, and a water-repellent filter, which permits the passage of air but prevents the passage of water therethrough, is mounted in the respiration hole.

Although in this second embodiment, the grooves 5c and the protruded portions 5d formed on the heat sink 5 of the first embodiment are unnecessary, a heat sink similar to the one used for the electronic control apparatus 1 of the first embodiment is also employed in the second embodiment and hence takes substantially the same shape. Of course, the heat sink 5 may be the one used in the first embodiment while excluding the grooves 5c and the protruded portions 5d.

The assembly procedure of the electronic control apparatus 1 according to this second embodiment is as follows. Specifically, similar to the first embodiment, a cream solder is coated on the circuit board 4, and then parts such as the microcomputer 13, its peripheral circuit elements, etc., are arranged on the circuit board 4, after which the cream solder is melted by using a reflow device so that the individual parts are soldered to the circuit board 4. Then, the water-repellent filter (not shown) is attached by heat welding to the respiration hole (not shown) formed in the housing 3.

Thereafter, the housing 3 is set in a state vertically inverted from that of FIG. 6, and the heat sink 5 is disposed in an upwardly directed one of the opening portions of the housing 3. Subsequently, the molten silicon bonding material 31 is filled into the grooves 30, and is then solidified so that the heat sink 5 is fixedly secured to the housing 3 by means of the silicon bonding material 31. Thus, the sealing between the housing 3 and the heat sink 5 is effected.

Then, the housing 3 with the heat sink 5 bonded thereto is inverted upside down and set, as shown in FIG. 6. The following steps of disposing the semiconductor switching elements 2 on the heat sink 5, and engaging the plate spring 21 with the housing 3 are the same as those in the first embodiment.

Here, note that the respiration hole may be formed in the cover 7 instead of the housing 3, and the water-repellent filter may be attached to this respiration hole. Also, the attachment of the water-repellent filter may be performed after a welding step of welding the cover 7 to the opening surface of the housing 3.

According to the electronic control apparatus 1 of this second embodiment, the grooves 30 are formed between the housing 3 and the heat sink 5, and the silicon bonding material 31 is filled into the grooves 30. With such an arrangement, the interior of the electronic control apparatus 1 is sealed to the outside, so that it is possible to prevent the infiltration of water or the like from the outside into the interior of the electronic control apparatus 1, thereby improving the waterproofness of the electronic control apparatus 1.

In addition, the cut surfaces 5a of the heat sink 5, being covered with the silicon bonding material 31, are not exposed to the outside, as a consequence of which even if there occurs a trouble such as an insulation failure due to the destruction or the like of the anodized aluminum film 25 in regions where the semiconductor switching elements 2 are mounted, the semiconductor switching elements 2 will not be electrically short-circuited from outside of the electronic control apparatus 1 through the cut surfaces 5a, so the electrical insulation performance of the electronic control apparatus 1 can be improved.

Moreover, the cut surfaces 5a of the heat sink 5 are covered with the silicon bonding material 31, and hence the entire surfaces of the heat sink main body 40 are covered with the anodized aluminum film 25 and the silicon bonding material 31, so even if liquid such as salt water which corrodes aluminum is attached to the electronic control apparatus 1, corrosion of the heat sink 5 can be prevented, thus making it possible to improve the corrosion resistance of the electronic control apparatus 1.

Further, the plate spring 21 is not only engaged with the housing 3 but also fixedly secured to the heat sink 5 by means of the screw 20 with the housing 3 interposed therebetween, and the housing 3 is fixedly secured to the heat sink 5 by means of the silicon bonding material 31, as a consequence of which a reduction of the urging force, acting to make the semiconductor switching elements 2 into intimate contact with the heat sink 5, will be small even if loosening of the screw 20 might occur. Accordingly, the heat generated by the semiconductor switching elements 2 can be dissipated to the heat sink 5, and the reliability in the heat dissipation of the electronic control apparatus can be improved.

Furthermore, the housing 3 is fixedly secured by the heat sink 5 and the silicon bonding material 31, so the number of the screws for mounting the housing 3 onto the heat sink 5 can be reduced, thus making it possible to reduce the production cost.

Although in the above-mentioned first and second embodiments, the bonding connections between the individual terminals VS, GT1, OUT, GT2, GND of the semiconductor switching elements 2 and the individual conductive plates 6 are made by means of laser welding, there may instead be used other welding methods such as resistance welding, TIG welding, etc. Also, other bonding methods such as ultrasonic bonding rather than welding may be used.

In addition, in the semiconductor switching elements 2, a half bridge having the high side MOSFET 2H and the low side MOSFET 2L integrated with each other is received in one package, and a pair of half bridges are used as one set and combined with each other to form a bridge circuit for switching the current of the electric motor 22, but the high side MOSFET 2H and the low side MOSFET 2L may be separately constructed, so that four separate or independent semiconductor switching elements 2 may be used to form such a bridge circuit. Also, six semiconductor switching elements 2 may be used to form a bridge circuit for driving and controlling a three-phase blushless motor.

Although the power device is composed of the semiconductor switching elements 2, other power devices such as diodes, thyristors, etc., may instead be used.

Moreover, the thickness of the conductive plates 6 is set to 0.8 mm, but other thicknesses such as 1.0 mm, 1.2 mm, etc., may be used as the thickness of the conductive plates 6 in consideration of the current flowing through the conductive plates 6, the intervals between the adjacent individual terminals VS, GT1, OUT, GT2, GND of the semiconductor switching elements 2, etc.

Although a fastening element comprises the screw 20 alone by which the plate spring 21 is attached to the heat sink 5 with the housing 3 interposed therebetween, it may additionally include a screw by which the housing 3 is directly attached to the heat sink 5.

In addition, the plate spring 21 is engaged with and fixedly secured to the housing 3 by tightening the screw 20 and press-fitting the engagement portions 21b to the inner sides of the holding portions 3b, but the plate spring 21 may be engaged with the housing 3 only by press-fitting the engagement portions 21b to the inner sides of the holding portions 3b, separately or independently from the tightening of the screw 20.

Further, reference has been made to an example in which the present invention is applied to the electric power steering system for a motor vehicle, but the present invention can be applied to an electronic control apparatus, which is provided with a power device and can handle a large current (e.g., 25 A or more), such as an electronic control apparatus in an antilock brake system (ABS), an electronic control apparatus associated with air conditioning, etc.

While the invention has been described in terms of preferred embodiments, those skilled in the art will recognize that the invention can be practiced with modifications within the spirit and scope of the appended claims.

What is claimed is:

1. An electronic control apparatus comprising:
a housing that is made of an insulating resin and has a pair of opening portions at opposite sides thereof respectively;
a heat sink that is attached to one of said opening portions of said housing;
a power device that is mounted on said heat sink;
a circuit board that is arranged in opposition to said heat sink, and has an electronic circuit including a control circuit for controlling said power device;
a plurality of conductive plates that have their base portions held by said housing and electrically connect said circuit board and said power device to each other; and
a resilient member that urges said power device to said heat sink;

wherein said resilient member is engaged with said housing, and wherein said resilient member is fixedly secured to said heat sink with said housing interposed therebetween by a fastening element.

2. The electronic control apparatus as set forth in claim 1, wherein said resilient member is a plate spring made of metal.

3. The electric control apparatus as set forth in claim 1, wherein said housing has engagement portions engaged with said heat sink.

4. The electronic control apparatus as set forth in claim 3, wherein said engagement portions are formed on said housing by integral molding.

5. The electronic control apparatus as set forth in claim 4, wherein said engagement portions are formed on inner sides of side walls of said housing.

6. The electronic control apparatus as set forth in claim 5, wherein said side walls have notched portions in those regions which are in opposition to said engagement portions.

7. The electronic control apparatus as set forth in claim 4, wherein said heat sink is formed at its edge portions with protruded portions, and said engagement portions have their tip end portions placed in abutting engagement with said protruded portions.

8. The electronic control apparatus as set forth in claim 1, wherein said heat sink has an insulating film formed on at least its surface on which said power device is mounted.

9. The electronic control apparatus as set forth in claim 8, wherein said insulating film is an anodized aluminum film, and said heat sink is formed by cutting an elongated, extruded shaped member of aluminum or aluminum alloy having an anodized aluminum film formed on its entire surface.

10. The electric control apparatus as set forth in claim 1, wherein grooves are formed between said housing and said heat sink, and an adhesive resin is filled and sealed into said grooves.

11. The electronic control apparatus as set forth in claim 1, further comprising:
a cover that is attached to the other of said opening portions of said housing for receiving said power device and said circuit board in cooperation with said heat sink;
wherein said cover is formed with a convex portion that protrudes toward said circuit board, and said convex portion protrudes from a hole formed in said circuit board to be disposed above said fastening element.

12. The electronic control apparatus as set forth in claim 1, wherein the power device has terminals, and the plurality of conductive plates each have an equal thickness to the width of the terminals of the power device.

* * * * *